United States Patent [19]
Furukawa et al.

[11] Patent Number: 5,708,292
[45] Date of Patent: Jan. 13, 1998

[54] POWER AMPLIFICATION CIRCUIT

[75] Inventors: Hidetoshi Furukawa; Daisuke Ueda, both of Osaka, Japan

[73] Assignee: Matsushita Electronics Corporation, Osaka, Japan

[21] Appl. No.: 704,163

[22] Filed: Aug. 28, 1996

[30] Foreign Application Priority Data

Aug. 29, 1995 [JP] Japan ................ 7-220223

[51] Int. Cl.$^6$ .................. H01L 29/04; H01L 31/036
[52] U.S. Cl. .................. 257/627; 257/272; 257/280
[58] Field of Search .................. 257/272, 280, 257/627, 628

[56] References Cited

U.S. PATENT DOCUMENTS

| | | | |
|---|---|---|---|
| 5,182,233 | 1/1993 | Inoue | 437/226 |
| 5,442,227 | 8/1995 | Fukaishi et al. | 257/628 |

FOREIGN PATENT DOCUMENTS

| | | |
|---|---|---|
| 58-139420 | 8/1983 | Japan . |
| 59-079577 | 5/1984 | Japan . |
| 61-114582 | 6/1986 | Japan . |
| 1-187981 | 7/1989 | Japan . |
| 3-126258 | 5/1991 | Japan . |
| 5-048078 | 2/1993 | Japan . |

*Primary Examiner*—Ngân V. Ngô
*Attorney, Agent, or Firm*—McDermott, Will & Emery

[57] ABSTRACT

Variations in the waveform of high-frequency signals amplified by a field-effect transistor (FET) in a power amplification circuit due to changes in temperature are reduced. A FET having an n-type active layer, a source electrode, a drain electrode and a gate electrode is formed on a (1 0 0)-crystal plane of a semi-insulating GaAs substrate. The FET is protected by a passivation film. The angle θ, formed between the longitudinal axial direction of the gate electrode and the <0 -1 -1>-direction, is set at an angle of from 0° to 90° corresponding to the impurity concentration of the n-type active layer, in order that the temperature coefficient of the FET threshold voltage becomes substantially equal to the temperature coefficient of the gate bias voltage applied from a power supply to the gate electrode. If the angle θ is set at 45°, then the temperature coefficient of the FET threshold voltage becomes zero.

6 Claims, 12 Drawing Sheets

POWER AMPLIFICATION CIRCUIT

BACKGROUND OF THE INVENTION

This invention relates to a power amplification circuit for high frequencies that employs a field-effect transistor (FET).

High-frequency power amplification FETs employing a compound semiconductor such as GaAs have been known in recent digital communication techniques. In a case where a FET is used for power amplification, a fixed bias point is established by grounding the source electrode and applying a drain bias voltage (VDD) and a gate bias voltage (VGG) to the drain electrode and to the gate electrode, respectively. When a high-frequency signal is superposition-inputted to the gate electrode, an amplified, high-frequency output signal is obtained at the drain electrode.

To obtain the maximum gain of a power amplification circuit, it is required to take the greatest power possible (the maximum available power) out of a signal source and feed it to a FET. To meet such a requirement, an input matching circuit is connected between the signal source and the gate electrode of the FET. In such a case, it is important that conjugate impedance matching is made to prevent the occurrence of high-frequency signal reflection at a connection between the input matching circuit and the FET.

Generally, VGG, generated by a gate bias voltage generation circuit, changes due to a variation in temperature, in other words there exists a temperature coefficient (TC) of the gate bias voltage (VGG). Therefore, when the FET bias point moves due to a change in ambient temperature, the power gain and the output distortion change. Additionally, there exists a TC of the dc characteristics of a compound semiconductor FET such as the mutual conductance (gm), the threshold voltage (Vth) and the drain current (ID). The TC of Vth shifts the transfer characteristic (i.e., the gate voltage-drain current characteristic curve (the VG-ID curve) ). Like the TC of VGG, the TC of Vth is a factor shifting the bias point.

FIG. 11 shows an example in which VGG (the gate bias voltage that is applied to the gate electrode of a conventional FET) and Vth' (the threshold voltage of the conventional FET) each change with T (the temperature). Generally, when performing the processing of signal amplification by means of a FET, VGG, which is equal to Vth0' at certain temperature T0, is set. That is, Vth0'=VGG0 holds at temperature T0. However, if the temperature T changes to temperature T1, to temperature T2 and to temperature T3, then Vth1'≠VGG1, Vth2'≠VGG2 and Vth3'≠VGG3. FIG. 12 graphically shows the movement of a bias point on the transfer characteristic (the VG-ID curve) according to the FIG. 11 variation. The drain current is ID0 at a bias point determined by a condition of Vth0'=VGG0 at temperature T0. However, as the temperature T changes to temperature T1, to temperature T2 and to temperature T3, the bias point moves as shown in the figure. As a result, the drain bias current changes to ID1, to ID2 and to ID3. FIG. 13 shows that the drain current ID at the bias point greatly changes with a change in the temperature T, in other words conventional power amplification circuits suffer from the problem that the waveform of high-frequency output signals changes by temperature.

In general, there exists a TC for the output impedance of input matching circuits as well as for the input impedance of FETs. If mismatching of these impedances occurs due to a change in ambient temperature, this increases the reflection of high-frequency signals occurring at a connection of the input matching circuit and the FET. This results in changes in the power gain and in the output distortion.

SUMMARY OF THE INVENTION

Accordingly, it is an object of the present invention to reduce the amplification characteristic variations of a FET-employing power amplification circuit due to temperature.

The present invention was made by directing attention to the fact that, by altering a direction in which the longitudinal axis of the gate electrode of a compound semiconductor FET is arranged, it becomes possible to freely control both the TC of the threshold voltage of a FET and the TC of the input impedance real part of the FET. Accordingly, it is possible to substantially equalize the TC of the threshold voltage of a FET and the TC of the gate bias voltage applied to the gate electrode of the FET. Additionally, it is also possible to substantially equalize the TC of the input impedance real part of a FET and the TC of the output impedance real part of an input matching circuit.

The above is described in detail. In a power amplification circuit of the present invention containing a FET comprising (a) an active layer formed on a (1 0 0)-crystal plane of a compound semiconductor substrate, (b) a source electrode and a drain electrode each of which forms an ohmic junction with the active layer and (c) a gate electrode which forms a Schottky junction with the active layer, an angle θ, formed between the longitudinal axial direction of the gate electrode of the FET and the <0 −1 −1>-direction of the compound semiconductor substrate is set such that the angle θ falls in the range from 0° to 90°, in order that the TC of the threshold voltage of the FET becomes substantially equal to the TC of the gate bias voltage or in order that the TC of the input impedance real part of the FET becomes substantially equal to the TC of the output impedance real part of the input matching circuit.

The test results show that (1) the TC of the FET threshold voltage has a negative value corresponding to the impurity concentration of the active layer when the angle θ is between 0° and 45°, (2) the TC is zero, regardless of the impurity concentration of the active layer, when the angle θ is equal to 45° and (3) the TC is a positive value corresponding to the impurity concentration of the active layer when the angle θ is between 45° and 90°. Accordingly, if the TC of the gate bias voltage is negative, the angle θ is set at an angle between 0° and 45° corresponding to the impurity concentration of the active layer. If the TC of the gate bias voltage is zero, the angle θ is set at an angle of 45°. If the TC of the gate bias voltage is positive, the angle θ is set at an angle between 45° and 90° corresponding to the impurity concentration of the active layer. When the setting of the angle θ is 45°, the TC of the FET threshold voltage becomes zero, which makes it possible, regardless of the TC of the gate bias voltage, to reduce a difference between the TC of the gate bias voltage and the TC of the FET threshold voltage.

Additionally, the test results show that (1) the TC of the FET input impedance real part has a negative value corresponding to the impurity concentration of the active layer when the angle θ is between 0° and 45°, (2) the TC is zero, regardless of the impurity concentration of the active layer, when the angle θ is equal to 45° and (3) the TC has a positive value corresponding to the impurity concentration of the active layer when the angle θ is between 45° and 90°. Accordingly, if the TC of the output impedance real part of the input matching circuit is negative, the angle θ is set at an angle between 0° and 45° corresponding to the impurity concentration of the active layer. If the TC of the output impedance real part of the input matching circuit is zero, the angle θ is set at an angle of 45°. If the TC of the output impedance real part of the input matching circuit is positive, the angle θ is set at an angle between 45° and 90° corresponding to the impurity concentration of the active layer. When the angle θ is set at an angle of 45°, the TC of the input impedance real part of the FET becomes zero, which makes it possible, regardless of the TC of the output impedance real part of the input matching circuit, to reduce a difference between the TC of the output impedance real part of the input matching circuit and the TC of the input impedance real part of the FET.

When the TC of the gate bias voltage is negative and, in addition, the TC of the output impedance real part of the input matching circuit is positive and vice versa, the angle θ is determined according to a change in the gate bias voltage with temperature or according to a change in the output impedance real part of the input matching circuit, whichever has a greater effect.

One advantage of the present invention is as follows. In accordance with the present invention, the direction, in which the longitudinal axis of the gate electrode of a compound semiconductor FET is arranged, is changed such that the TC of the threshold voltage of the FET is made substantially equal to the TC of the gate bias voltage or such that the TC of the input impedance real part of the FET is made substantially equal to the TC of the output impedance real part of the input matching circuit. As a result of such arrangement, the amplification temperature characteristics of power amplification circuit employing such a FET is improved with satisfactory effects.

DETAILED DESCRIPTION OF THE INVENTION

Figure 1:
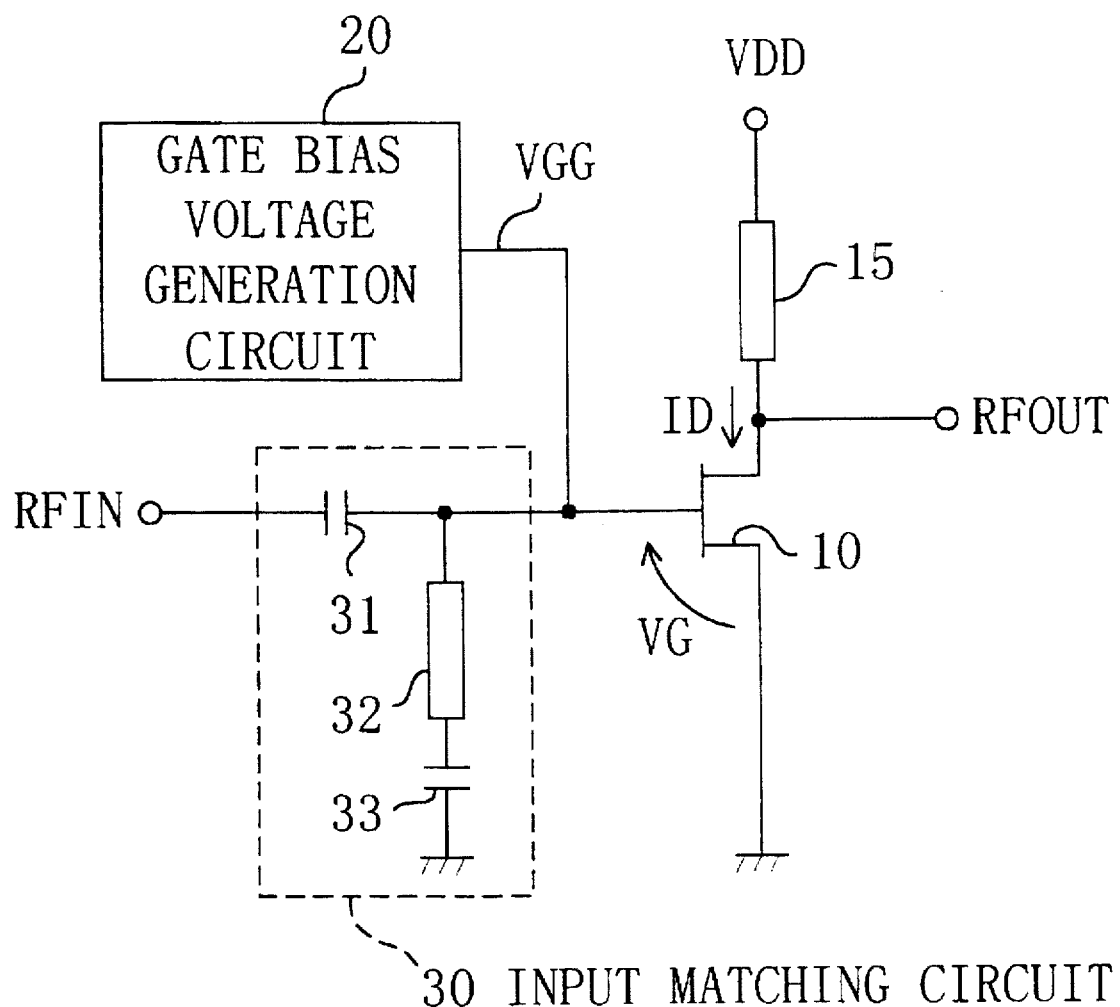
FIG. 1 is a block diagram showing an example of the configuration of a power amplification circuit in accordance with the present invention.

FIG. 1 Shows a power amplification circuit in accordance with the present invention. The power amplification circuit shown in FIG. 1 amplifies the power of a high-frequency input signal RFIN received from a signal source (not shown in the figure) and provides a high-frequency output signal RFOUT to a load (not shown). This amplification circuit comprises a FET 10 prepared on a (1 0 0)-crystal plane of a semi-insulating GaAs substrate, a microstrip line 15 connected to the drain electrode of the FET 10 for the application of VDD (the drain bias voltage) thereto and a gate bias voltage generation circuit 20 for the application of VGG (the gate bias voltage) to the gate electrode of the FET 10. The source electrode of the FET 10 is grounded. Connected between the signal source and the FET 10 is an input matching circuit 30 which comprises two capacitors 31 and 33 and a single microstrip line 32.

More specifically, the frequency of SIGNAL RFIN is 1 GHz, the drain bias voltage VDD is 4 V and the gate bias voltage VGG is −1 V. The electrostatic capacity of the capacitor 31 is 8 pF and the electrostatic capacity of the capacitor 33 is 1000 pF. The width of the microstrip line 32 is 200 μm and the length thereof is 2 mm. The TC of VGG is 0.5 mV/°C. The TC of the output impedance real part of the input matching circuit 30 is −12 mΩ/°C.

Figure 2:
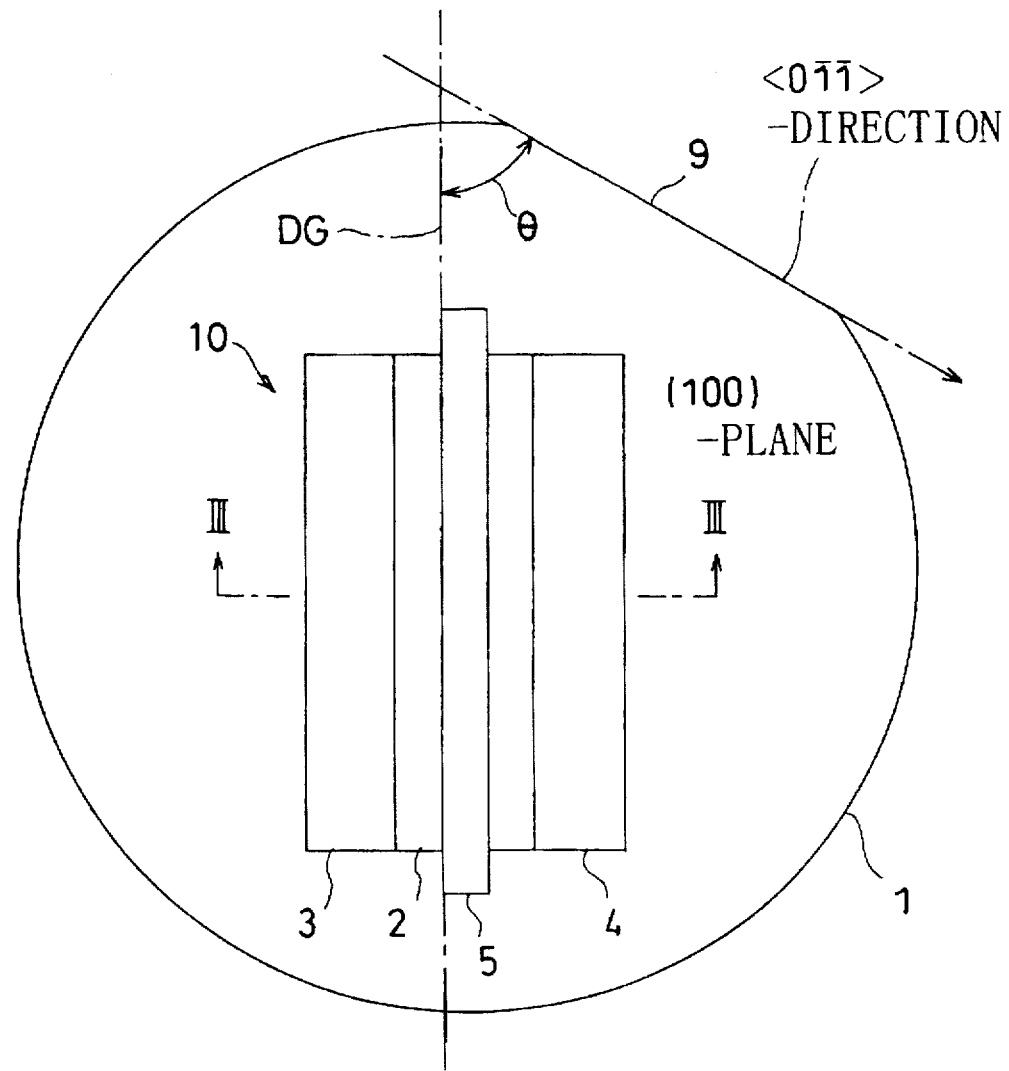
FIG. 2 is a top view schematically illustrating the FET of FIG. 1 prepared on a (1 0 0)-crystal plane of a semi-insulating GaAs substrate.
Figure 3:
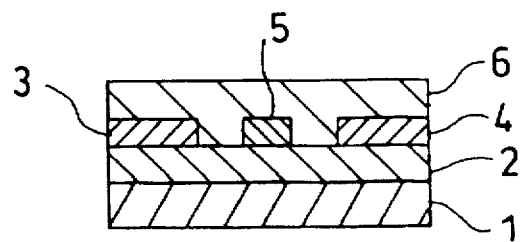
FIG. 3 is a cross-sectional view taken on line II—III of FIG. 2.

FIG. 2 is a top view schematically illustrating the FET 10 shown in FIG. 1. FIG. 3 is a cross-sectional view taken on line III—III. The FET 10 is prepared in the following way. An n-type active layer 2, which is doped with n-type impurities, is formed on a (1 0 0)-crystal plane of a semi-insulating GaAs substrate 1. Two regions of an alloy of Au, Ge and Ni are formed on the surface of the n-type active layer 2, each region having a thickness of 200 nm. Subsequently, an annealing process is performed at 400° C. in an inert gas atmosphere so that these two regions, which become a source electrode 3 and a drain electrode 4, respectively, each forms an ohmic junction with the n-type active layer 2. Formed midway between the source electrode 3 and the drain electrode 4 on the n-type active layer 2 is an aluminum (Al) region. This Al region forms a schottky junction with the n-type active layer 2, has a thickness of 500 nm, a width of 20 mm and a length of 1 μm and becomes a gate electrode 5. A silicon nitride film, i.e., a p-SiN film, is deposited 300 nm by a plasma CVD technique for the surface protection of the FET. This silicon nitride film is a passivation film 6. In FIG. 2, the direction along an orientation flat 9 is the <0 −1 −1>-direction and the angle, formed between the longitudinal axial direction of the gate electrode 5 (DG) and the <0 −1 −1>-direction, is defined as an angle θ indicative of a gate orientation. FIG. 2 depicts the FET 10, with the passivation film 6 removed.

Figure 4:
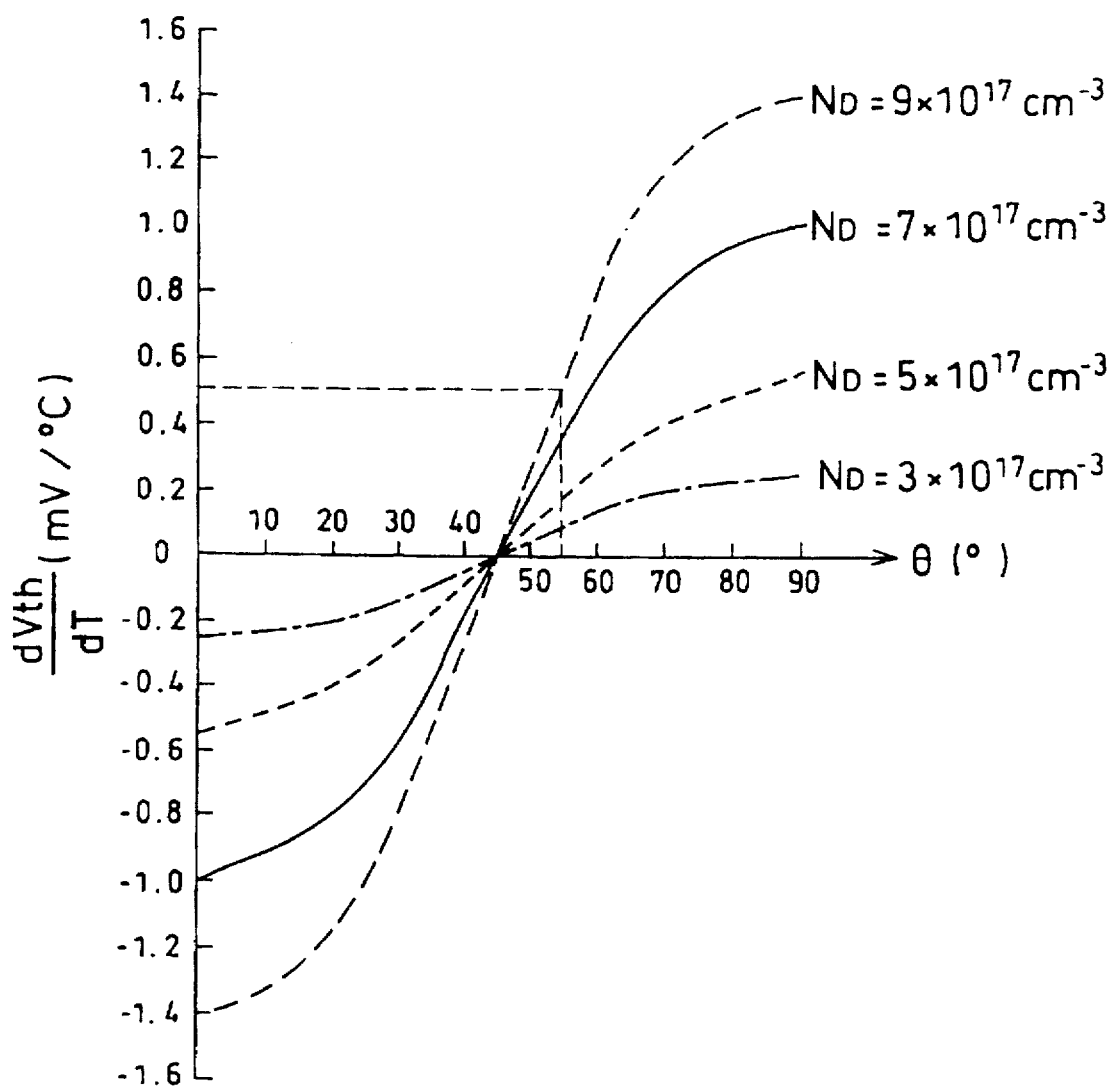
FIG. 4 shows the relationship between θ, which is the angle formed between the longitudinal axial direction of the gate electrode of the FET shown in FIG. 2, and the TC of Vth which is the threshold voltage of the FET, using ND, which is the impurity concentration of the n-type active layer of the FET, as a parameter.

FIG. 4 shows a relationship between the angle θ and the TC of the threshold voltage Vth (dVth/dT) using the impurity concentration (ND) of the n-type active layer 2 as a parameter. FIG. 4 shows that (i) dVth/dT<0 when the angle θ falls in the range from 0° to 45°, (ii) dVth/dT=0 when the angle θ is equal to 45° and (iii) dVth/dT>0 when the angle θ falls in the range from 45° to 90°. Although there are produced somewhat variations caused by the thickness of the passivation film 6 and by the internal stress of the passivation film 6, basically the property that the TC of Vth (dVth/dT) becomes zero when the angle θ=45° remains. In addition, even if a plane of the semi-insulating GaAs substrate 1 on which the FET 10 is prepared inclines by about 10° from the (1 0 0)-crystal plane, basically the same property as shown in FIG. 4 is exhibited.

Since dVGG/dT (the TC of VGG that is applied to the FET 10) is 0.5 mV/°C. according to the FIG. 1 example, ND and θ for the FET 10 are set from the FIG. 4 relationship such that they are 9×10$^{17}$ cm$^{-3}$ and 54°, respectively, when the VGG variation with temperature is given importance. At this time, dVth/dT=dVGG/dT=0.5 mV/°C.

Figure 5:
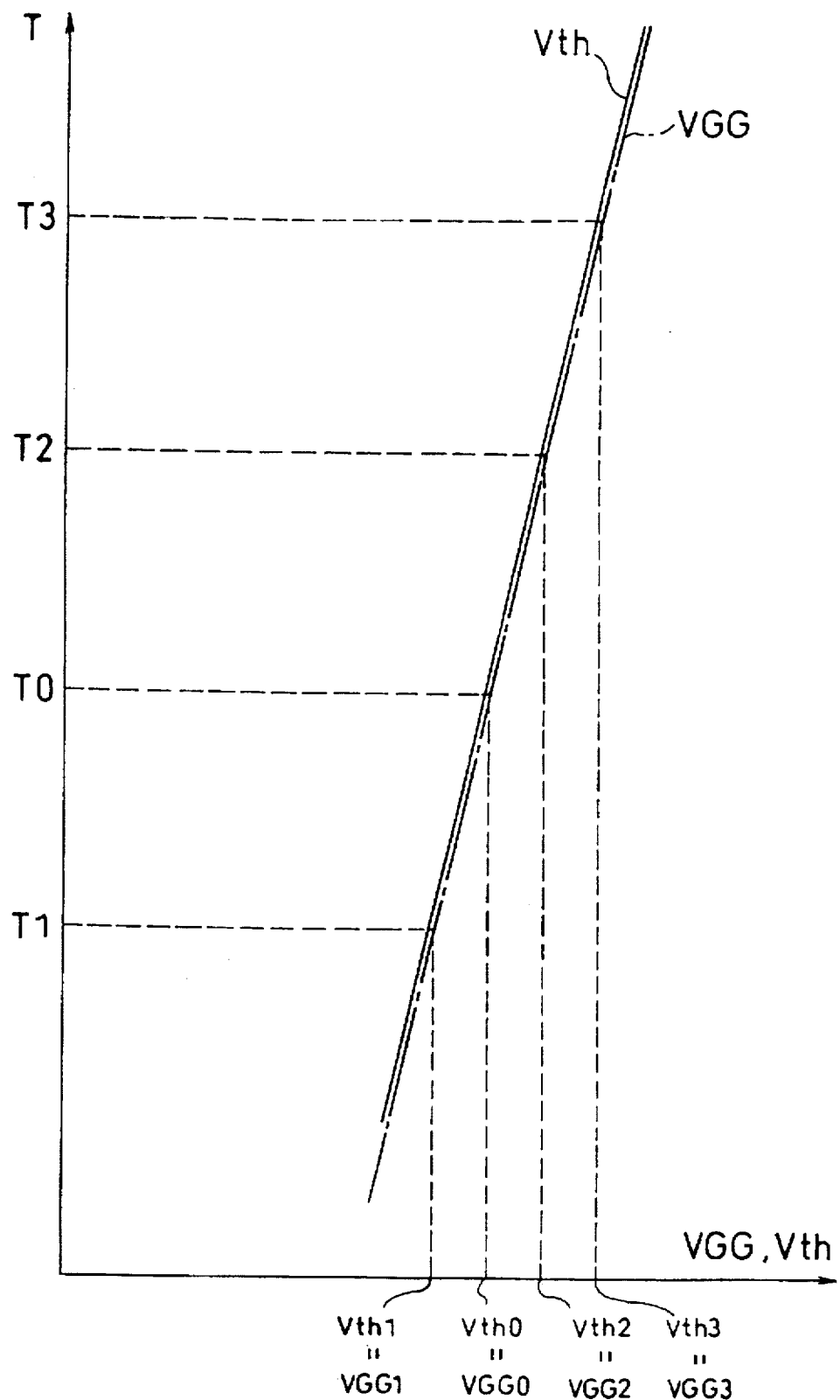
FIG. 5 shows the relationship of VGG and Vth with respect to T where VGG is the gate bias voltage that is applied to the gate electrode of the FET shown in FIG. 1, Vth is the threshold voltage of the FET and T is the temperature.
Figure 6:
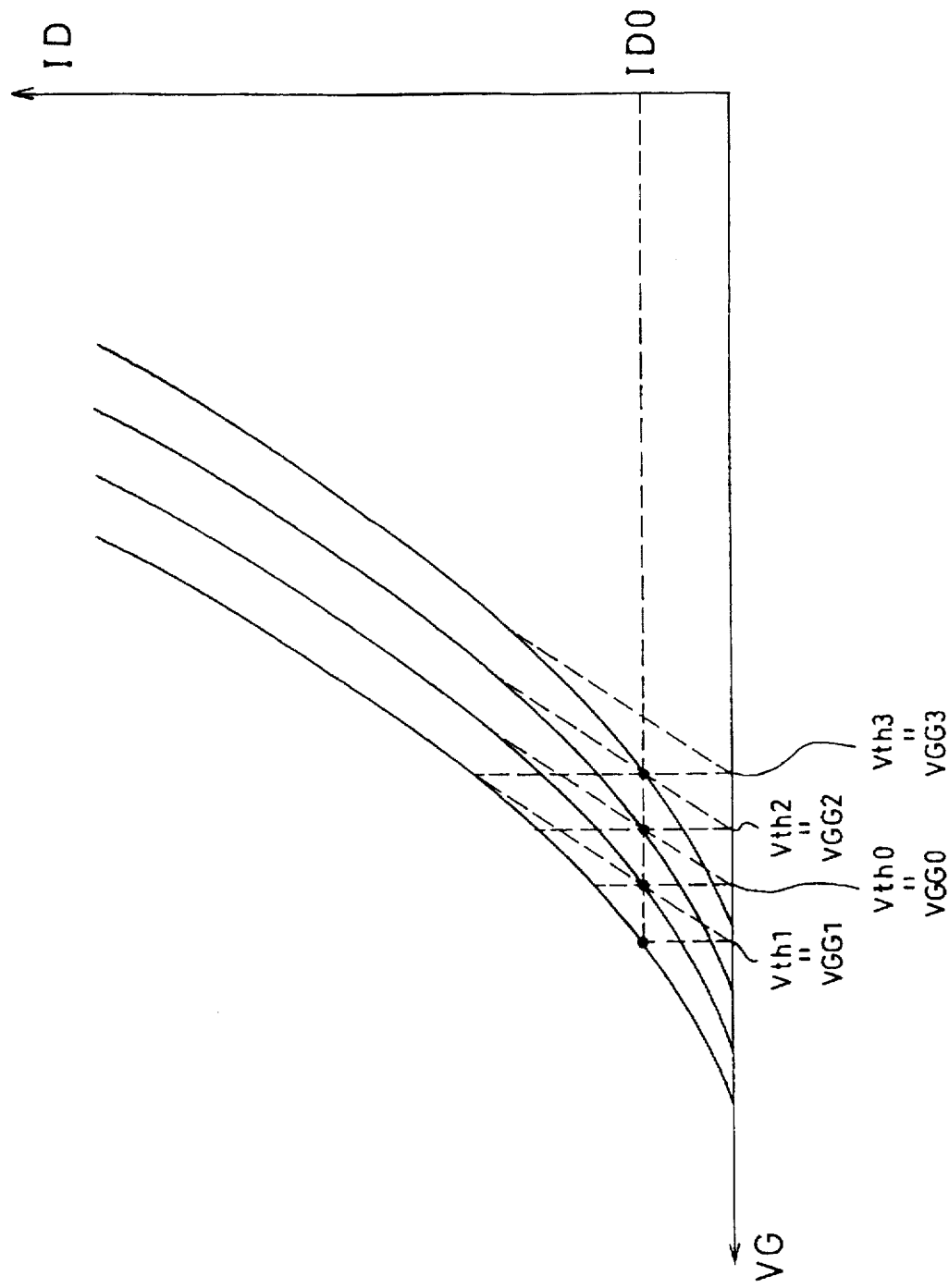
FIG. 6 shows variations in the relationship between VG and ID with respect to temperature where VG and ID are the gate voltage and the drain current of the FIG. 1 FET.
Figure 7:
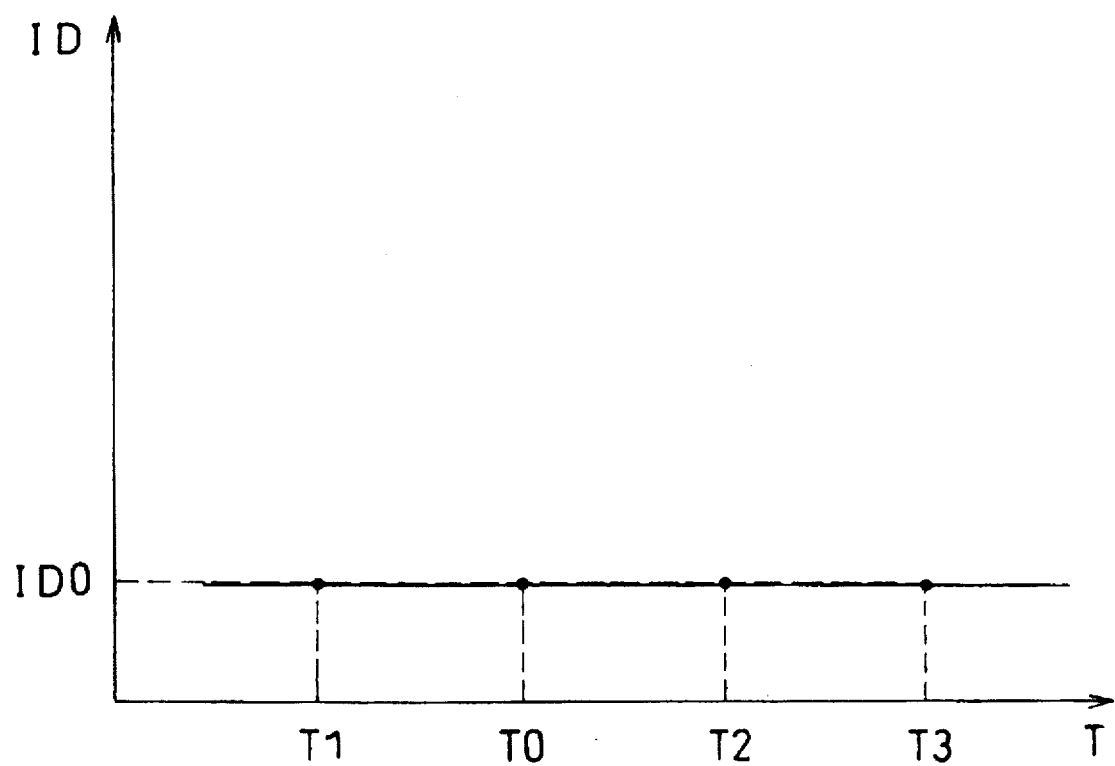
FIG. 7 shows the ID versus T relationship of the FIG. 1 FET.

FIG. 5 shows Vth variations of the FET 10 due to changes in temperature and VGG variations due to changes in temperature. Since dVth/dT=dVGG/dT, Vth=VGG holds at arbitrary temperature T if Vth0=VGG0 is made to hold at temperature T0 as in the prior art. In other words, even when the temperature T moves to temperature T1, to temperature T2 and to temperature T3, the following equations still hold: (1) Vth1=VGG1, (2) Vth2=VGG2 and (3) Vth3=VGG3. FIG. 6 shows the movement of a bias point on the transfer characteristic (the VG-ID curve) of the FET 10 according to the FIG. 5 variation. Although the bias point moves with the temperature T, the drain bias current at each temperature T0, T1, T2 and T3 has a constant value of ID0. In other words, even when the temperature T changes the position of the bias point in the ID axial direction does not change. FIG. 7 shows that the drain bias current is constant even when the bias point moves with the temperature T as in the case of FIG. 6. As a result, no waveform variations occur to SIGNAL RFOUT of FIG. 1.

Figure 8:
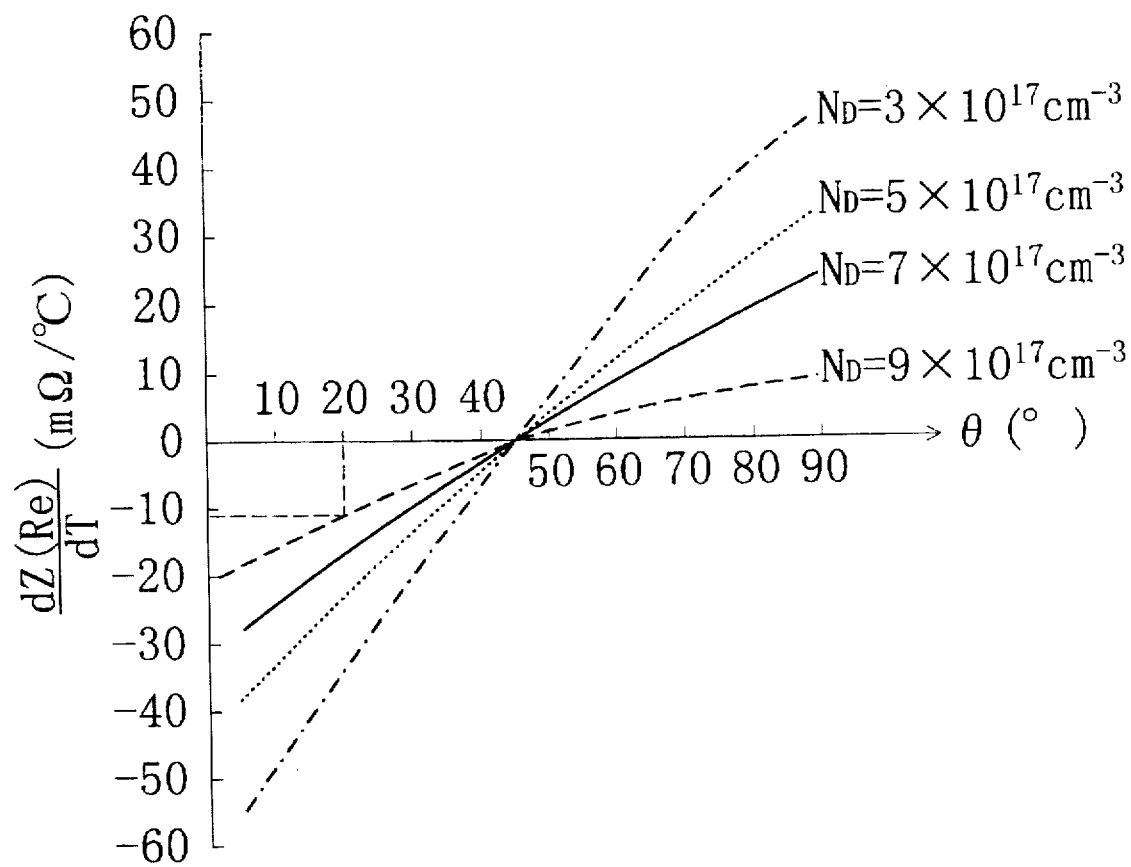
FIG. 8 shows the relationship between θ, which is the angle formed between the longitudinal axial direction of the gate electrode of the FET shown in FIG. 2, and the TC of an input impedance real part Z(Re) of the FET, using ND, which is the impurity concentration of the n-type active layer of the FET, as a parameter.

FIG. 8 shows graphically the relationship between the angle θ and the TC of the input impedance real part Z(Re) of the FET 10 (dZ(Re)/dT) using the impurity concentration ND of the n-type active layer 2 as a parameter. With reference to FIG. 8, dZ(Re)/dT<0 when the angle θ falls in the range from 0° to 45°, and dZ(Re)/dT=0 when the angle θ is equal to 45°, and dZ(Re)/dT>0 when the angle θ falls in the range from 45° to 90°.

In the FIG. 1 example, the TC of the output impedance real part of the input matching circuit 30 is −12 mΩ/°C. and therefore it is set for the FET 10 from the FIG. 8 relationship such that ND=9×10$^{17}$ cm$^{-3}$ and θ=20° when impedance matching is given importance. In such a case, dZ(Re)/dT (the TC of the input impedance real part of the FET 10) becomes −12 mΩ/°C. Accordingly, if impedance matching is realized at temperature T0, this ensures that high-frequency signal reflection occurring at the connection between the input matching circuit 30 and the FET 10 does not increase even when there is a variation in ambient temperature.

Further, if the angle θ is set at 45° in the above-described example, then the TC of the threshold voltage of the FET 10 becomes zero thereby making it possible to reduce the difference between the TC of the gate bias voltage (VGG) and the TC of the threshold voltage of the FET 10, regardless of the TC of the gate bias voltage VGG. Additionally, if the angle θ is set at 45°, then the TC of the input impedance real part of the FET 10 becomes zero thereby making it possible to reduce the difference between the TC of the output impedance real part of the input matching circuit 30 and the TC of the input impedance real part of the FET 10, regardless of the TC of the output impedance real part of the input matching circuit 30.

Figure 9:
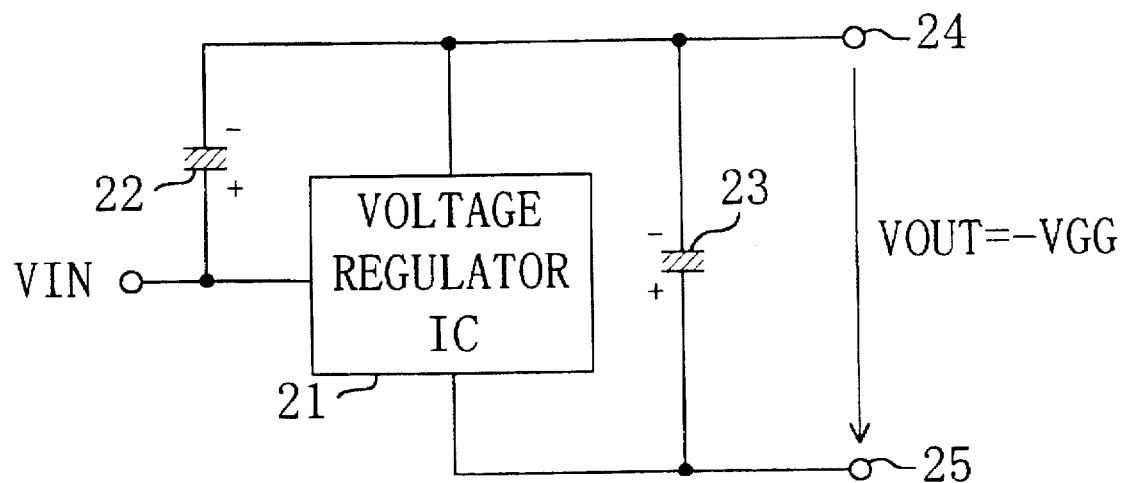
FIG. 9 is a circuit diagram showing an example of the internal configuration of the gate bias voltage generation circuit.

FIG. 9 shows an internal configuration example of the gate bias voltage generation circuit. The gate bias voltage generation circuit 20a generates an about 5V dc output voltage VOUT from a 12V dc input voltage VIN and comprises a voltage regulator IC 21 with three terminals and two capacitors 22 and 23.

More specifically, the voltage regulator IC 21 is an AN6545 which is a product by Matsushita Electronics Corporation. The electrostatic capacity of each of the capacitors 22 and 23 is 10 μF. With reference to FIG. 9, an output terminal 24 is connected to the gate electrode of the FET in the power amplification circuit and an output terminal 25 is connected to the source electrode of the FET. In other words, the VOUT versus VGG (the gate electrode potential with respect to the source electrode) relationship is given by VOUT=−VGG.

Figure 10:
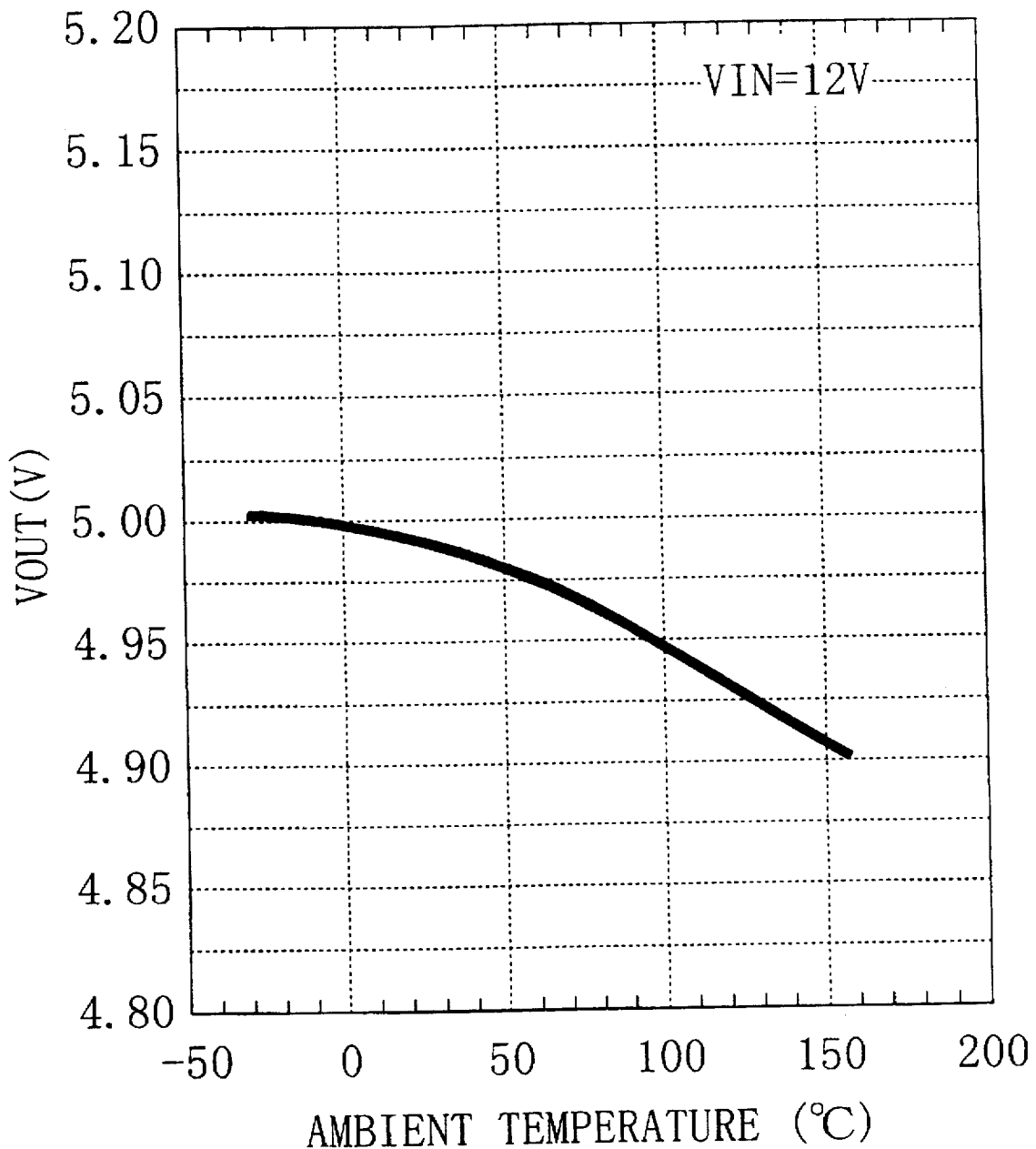
FIG. 10 shows the relationship between output voltage VOUT of the FIG. 9 circuit and ambient temperature.
Figure 11:
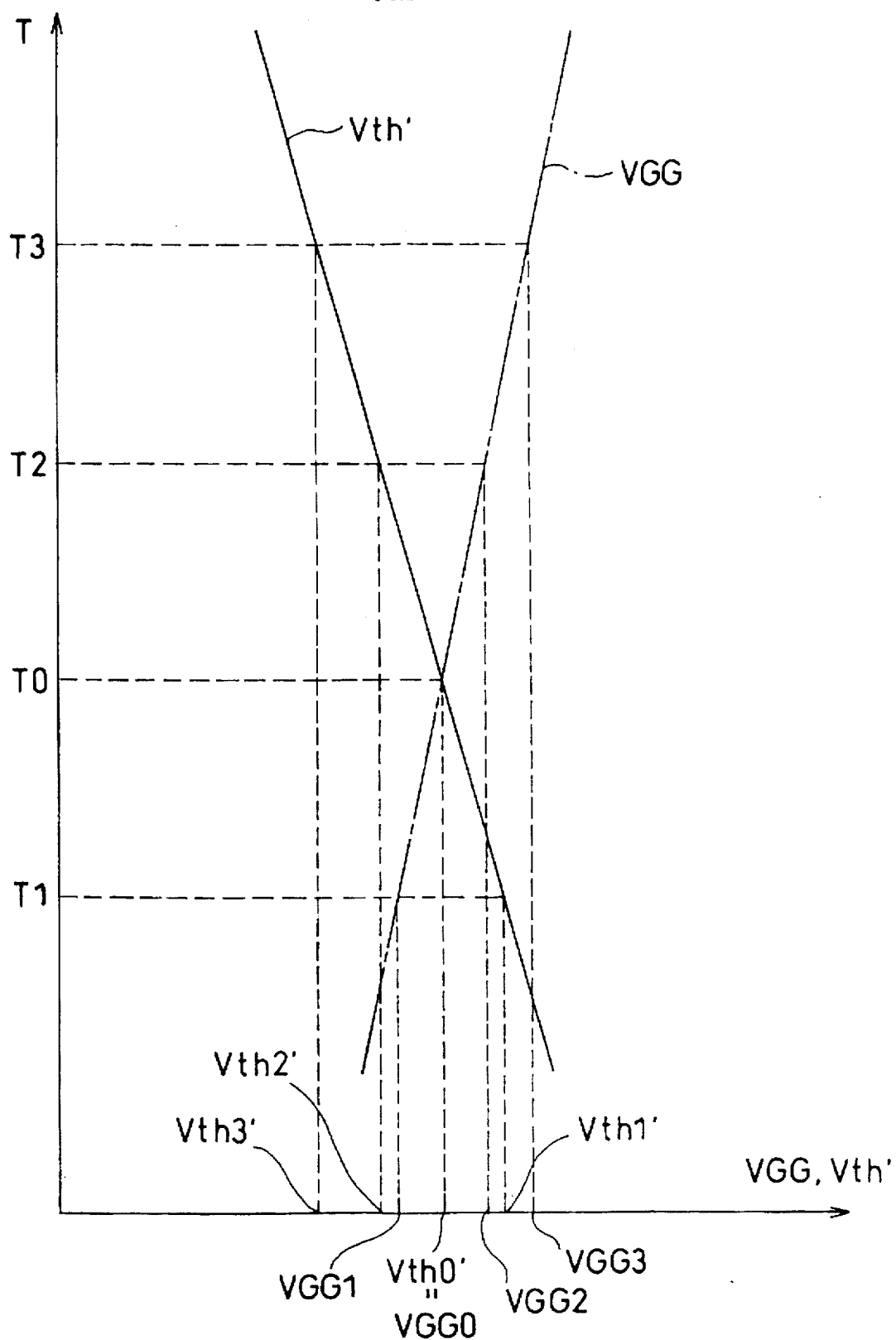
FIG. 11 shows the relationship of VGG and Vth' with respect to T where VGG is the gate bias voltage that is applied to the gate electrode of a conventional FET, Vth' is the threshold voltage of the FET and T is the temperature.
Figure 12:
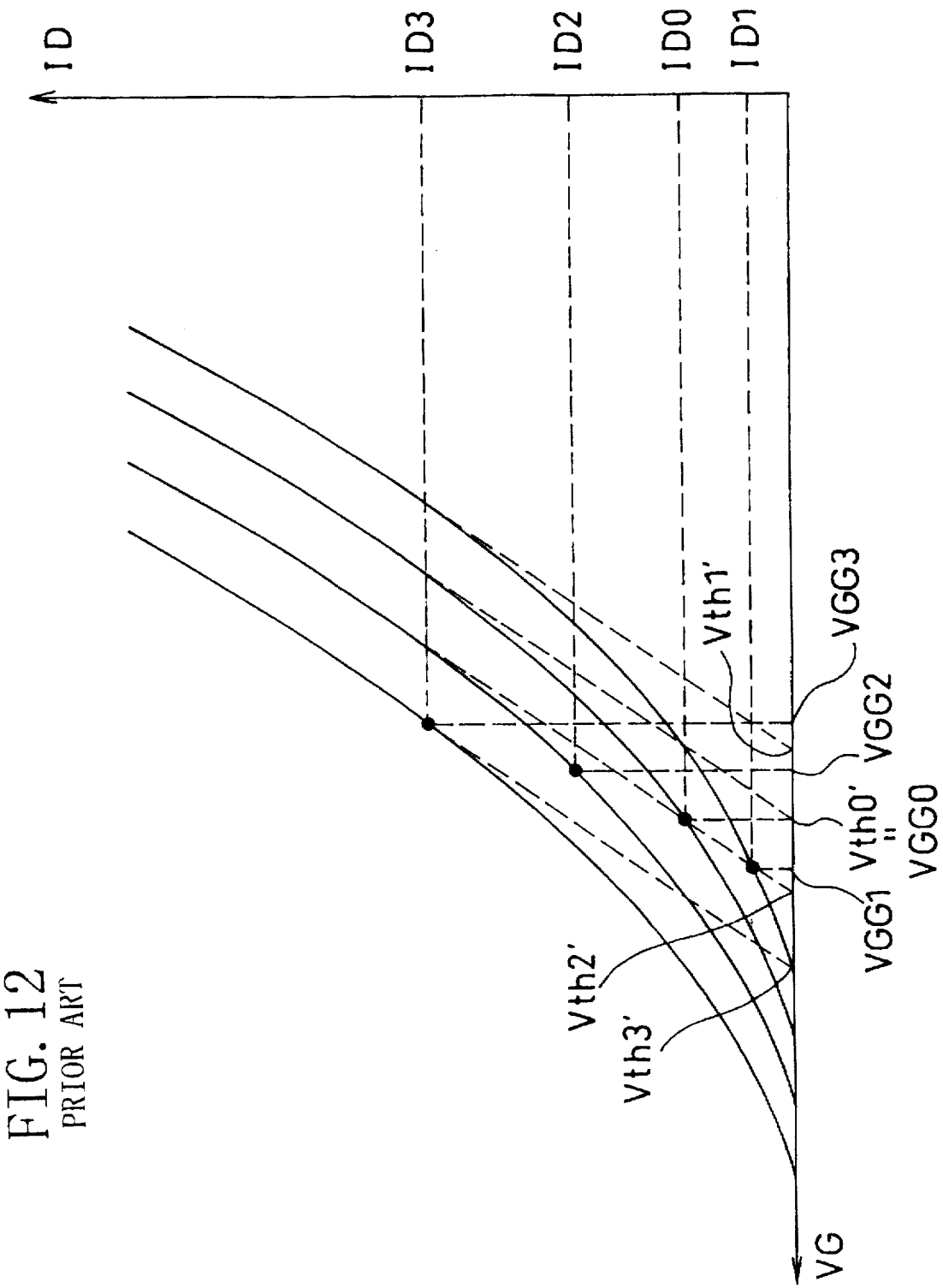
FIG. 12 shows variations in the relationship between VG and ID with respect to temperature where VG and ID are the gate voltage and the drain current of the conventional FET.
Figure 13:
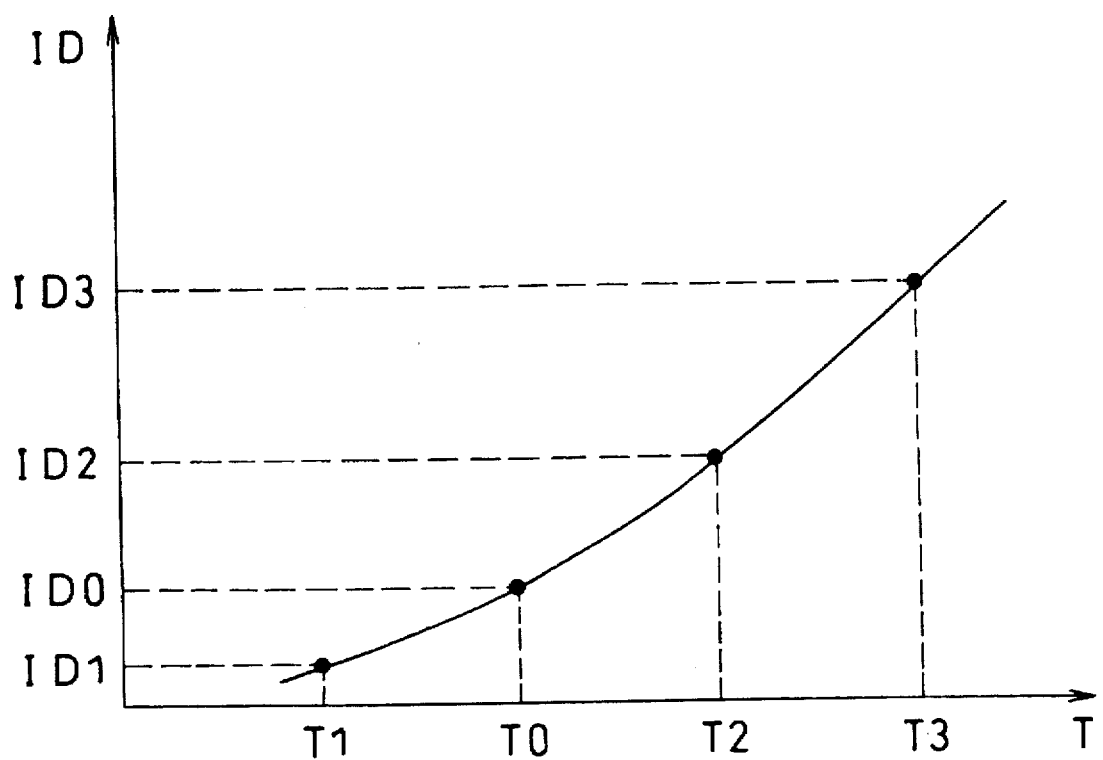
FIG. 13 shows the ID versus T relationship of the conventional FET.

FIG. 10 is a graphical diagram showing VOUT variations due to ambient temperature. According to FIG. 10, dVOUT/dT=0.5 mV/°C. is obtained as a mean value of the temperature range from 0° C. to 100° C. (i.e., the FIG. 9 circuit's operation guarantee range). That is, the TC of VGG generated by the FIG. 9 circuit is 0.5 mV/°C. Accordingly, in order to cancel such a VGG TC, a FET, in which it is set from the FIG. 4 relationship such that ND=9×10$^{17}$ cm$^{-3}$ and θ=54°, is employed, which is similar to the FIG. 1 example.

It should be understood that various changes in the FET cross-sectional structure, in the material and dimensions of each part, in the active layer impurity concentration and in the fabrication method may be made to the present invention. For example, the present invention finds applications in cases where a recess structure is formed in an area peripheral to a gate electrode as well as in cases where a multilayer structure is formed over a semi-insulating GaAs substrate. The present invention further finds applications in cases where dielectric films as a passivation film, e.g., a silicon oxide film, are formed employing a different deposition method as well as in cases where no passivation films are formed.

The invention claimed is:

1. A power amplification circuit comprising a field-effect transistor for amplifying the power of an in. high-frequency signal and a voltage generation circuit for generating a gate bias voltage to said field-effect transistor, said field-effect transistor comprising:

an active layer formed on a (1 0 0)-crystal plane of a compound semiconductor substrate;

a source electrode and a drain electrode, each of said source and drain electrodes forming an ohmic junction with said active layer; and a gate electrode which forms a Schottky junction with said active layer;

wherein:

an angle θ, formed between the longitudinal axial direction of said gate electrode and the <0 −1 −1>-direction of said compound semiconductor substrate, is set so as to fall in the range from 0° to 90° in order that a temperature coefficient of the threshold voltage of said field-effect transistor becomes substantially equal to a temperature coefficient of said gate bias voltage.

2. A power amplification circuit according to claim 1 wherein said angle θ is set according to the impurity concentration of said active layer.

3. A power amplification circuit according to claim 1 wherein said angle θ is 45°.

4. A power amplification circuit comprising a field-effect transistor for amplifying the power of an input high-frequency signal and an input matching circuit connected between a signal source and said field-effect transistor, said field-effect transistor comprising:

an active layer formed on a (1 0 0)-crystal plane of a compound semiconductor substrate;

a source electrode and a drain electrode, each of said source and drain electrodes forming an ohmic junction with said active layer; and a gate electrode which forms a Schottky junction with said active layer and is connected to said input matching circuit;

wherein:

an angle θ, formed between the longitudinal axial direction of said gate electrode and the <0 −1 −1> direction of said compound semiconductor substrate, is set so as to fall in the range from 0° to 90° in order that a temperature coefficient of the input impedance real part of said field-effect transistor becomes substantially equal to a temperature coefficient of the output impedance real part of said input matching circuit.

5. A power amplification circuit according to claim 4 wherein said angle θ is set according to the impurity concentration of said active layer.

6. A power amplification circuit according to claim 4 wherein said angle θ is 45°.

* * * * *

UNITED STATES PATENT AND TRADEMARK OFFICE
CERTIFICATE OF CORRECTION

PATENT NO. : 5,708,292
DATED : January 13, 1998
INVENTOR(S) : Hidetoshi FURUKAWA et al.

It is certified that error appears in the above-indentified patent and that said Letters Patent is hereby corrected as shown below:

Col. 6, line 45, delete "in," and insert --input--.

Signed and Sealed this

Twenty-first Day of April, 1998

Attest:

BRUCE LEHMAN

Attesting Officer    Commissioner of Patents and Trademarks